(12) United States Patent
Bedeschi

(10) Patent No.: US 9,001,575 B2
(45) Date of Patent: Apr. 7, 2015

(54) ENCODING PROGRAM BITS TO DECOUPLE ADJACENT WORDLINES IN A MEMORY DEVICE

(75) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 13/435,243

(22) Filed: Mar. 30, 2012

(65) Prior Publication Data

US 2013/0262743 A1    Oct. 3, 2013

(51) Int. Cl.
G11C 16/02 (2006.01)
G11C 7/10 (2006.01)
G11C 8/10 (2006.01)
G11C 8/14 (2006.01)

(52) U.S. Cl.
CPC ............ *G11C 8/10* (2013.01); *G11C 7/1006* (2013.01); *G11C 8/14* (2013.01)

(58) Field of Classification Search
USPC ........................................................ 711/103
See application file for complete search history.

(56) References Cited

U.S. PATENT DOCUMENTS

| 7,266,741 | B2 | 9/2007 | Luk |
| 7,308,471 | B2 | 12/2007 | Rumynin |
| 7,630,257 | B2 | 12/2009 | Madan et al. |
| 7,701,765 | B2 | 4/2010 | Aritome |
| 7,952,922 | B2 | 5/2011 | Aritome |
| 7,984,360 | B2 | 7/2011 | Sharon et al. |
| 8,031,526 | B1 * | 10/2011 | Wu et al. ................. 365/185.18 |
| 8,050,086 | B2 | 11/2011 | Shalvi et al. |
| 8,144,505 | B2 | 3/2012 | Lee |
| 8,169,825 | B1 | 5/2012 | Shalvi et al. |
| 8,228,701 | B2 | 7/2012 | Sokolov et al. |
| 8,238,157 | B1 | 8/2012 | Sommer et al. |
| 8,300,478 | B2 | 10/2012 | Shalvi et al. |
| 8,310,876 | B2 | 11/2012 | Yoo et al. |
| 8,335,107 | B2 | 12/2012 | Lee |
| 8,369,147 | B2 | 2/2013 | Aritome |
| 8,391,062 | B2 | 3/2013 | Jang |
| 8,437,185 | B2 | 5/2013 | Shalvi et al. |
| 8,462,548 | B2 | 6/2013 | Aritome |
| 8,570,804 | B2 | 10/2013 | Shalvi et al. |
| 8,593,873 | B2 | 11/2013 | Cerafogli et al. |
| 8,681,543 | B2 | 3/2014 | Jang |
| 8,693,247 | B2 | 4/2014 | Yoon et al. |
| 8,717,792 | B2 | 5/2014 | Sokolov et al. |
| 8,743,622 | B2 | 6/2014 | Tanzawa |
| 8,767,469 | B2 | 7/2014 | Kim |
| 2004/0225705 | A1 * | 11/2004 | Rumynin ................ 708/620 |
| 2006/0123288 | A1 * | 6/2006 | Luk ........................... 714/724 |

(Continued)

FOREIGN PATENT DOCUMENTS

WO    WO 2008085254    7/2008

OTHER PUBLICATIONS

U.S. Appl. No. 13/457,799, filed Apr. 27, 2012, entitled Program-Disturb Decoupling for Adjacent Wordlines of a Memory Device, pending (including its prosecution history, the cited references, and the Office Actions therein).

*Primary Examiner* — Aimee Li
*Assistant Examiner* — Trang Ta
(74) *Attorney, Agent, or Firm* — Knobbe, Martens Olson & Bear, LLP

(57) ABSTRACT

Subject matter disclosed herein relates to memory operations regarding encoding program bits to be programmed into a memory array.

17 Claims, 4 Drawing Sheets

(56) References Cited

U.S. PATENT DOCUMENTS

| | | | |
|---|---|---|---|
| 2008/0084773 A1* | 4/2008 | Madan et al. | 365/202 |
| 2008/0158948 A1* | 7/2008 | Sharon et al. | 365/185.02 |
| 2010/0020615 A1* | 1/2010 | Miwa et al. | 365/185.18 |
| 2010/0265764 A1* | 10/2010 | Yoo et al. | 365/185.02 |
| 2012/0127801 A1 | 5/2012 | Kim | |
| 2012/0195118 A1 | 8/2012 | Yang | |
| 2012/0262970 A1 | 10/2012 | Sokolov et al. | |
| 2012/0262971 A1 | 10/2012 | Sokolov et al. | |
| 2012/0268990 A1 | 10/2012 | Sommer et al. | |
| 2012/0290897 A1 | 11/2012 | Yoon et al. | |
| 2013/0007353 A1 | 1/2013 | Shim et al. | |
| 2013/0141972 A1 | 6/2013 | Yoon et al. | |
| 2013/0141974 A1 | 6/2013 | Jang | |
| 2013/0167251 A1 | 6/2013 | Pio | |
| 2013/0182510 A1 | 7/2013 | Tanzawa | |
| 2013/0235665 A1 | 9/2013 | Khaef | |
| 2013/0290604 A1 | 10/2013 | Bedeschi | |
| 2013/0311837 A1 | 11/2013 | Bedeschi | |
| 2013/0279260 A1 | 10/2014 | Yoon et al. | |

* cited by examiner

ENCODING PROGRAM BITS TO DECOUPLE ADJACENT WORDLINES IN A MEMORY DEVICE

BACKGROUND

1. Field

Subject matter disclosed herein relates to memory operations regarding encoding program bits to be programmed into a memory array.

2. Information

Memory devices may be employed in various electronic devices, such as computers, cell phones, PDA's, data loggers, or navigational equipment, just to name a few examples. For example, various types of nonvolatile memory devices may be employed, such as solid state drives (SSD), NAND or NOR flash memory, or phase change memory, among others. In general, writing or programming operations may be used to store information, while read operations may be used to retrieve stored information.

Phase change memory (PCM) may operate based, at least in part, on behavior or properties of one or more particular phase change materials, such as chalcogenide glass or germanium antimony telluride (GST), just to name a few examples. Electrical resistivities of crystalline or amorphous states of such materials may be different from one another, thus presenting a basis by which information may be represented or expressed. The amorphous, high resistance state may represent a stored first binary state and the crystalline, low resistance state may represent a stored second binary state. Of course, such a binary representation of stored information is merely an example. PCM may also be used to store multiple memory states, represented by varying degrees of phase change material resistivity, for example.

Nonvolatile memory devices, such as PCM, may comprise wordlines and bitlines to program an array of memory cells. As density of memory cells in an array increase, distances between adjacent wordlines or bitlines may decrease. Decreased spacing among wordlines or bitlines may lead to undesirable effects, such as capacitive coupling, crosstalk, or memory disturb, just to name a few examples.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
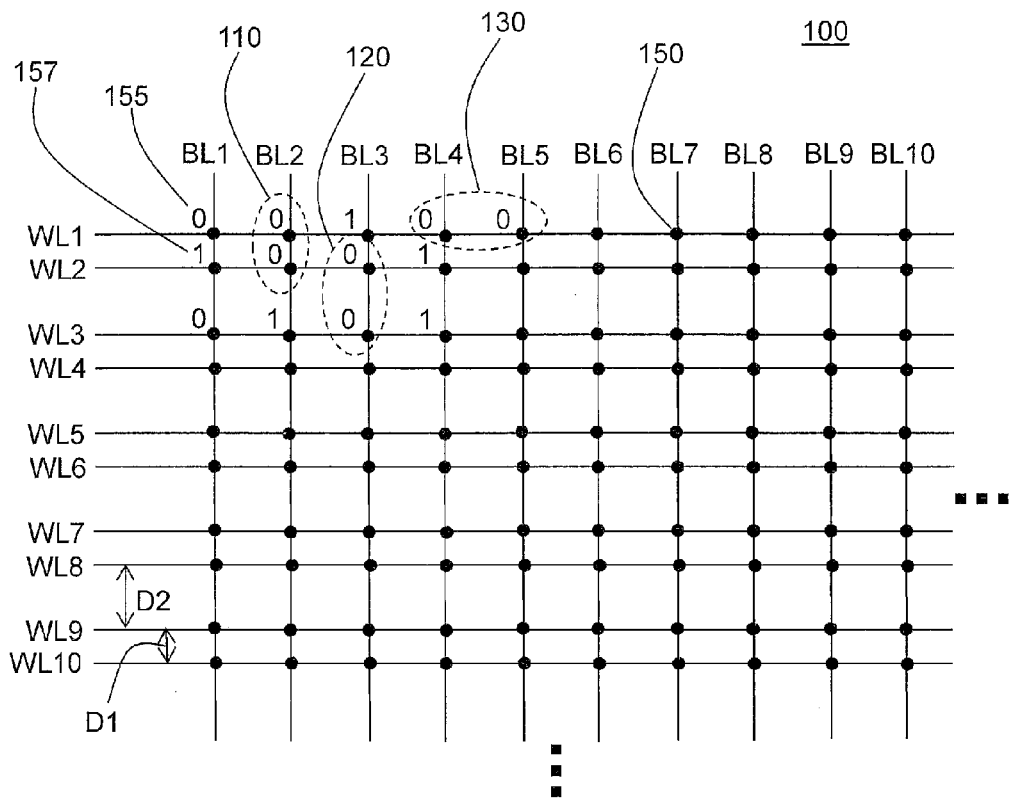
FIG. 1 is a schematic diagram of a portion of a memory array, according to an embodiment.

Reference throughout this specification to "one embodiment" or "an embodiment" means that a particular feature, structure, or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, or characteristics may be combined in one or more embodiments.

A phase change memory (PCM) cell, if used to store a binary logic value, may be set or reset to one of two states. For example, an amorphous, high resistance state may represent a stored first binary state (e.g., a zero-bit) and a crystalline, low resistance state may represent a stored second binary state (e.g., a one-bit). A PCM cell may be programmed to a zero-bit by resetting the PCM cell to an amorphous state by applying a relatively high amplitude, relatively short duration electrical programming pulse or signal so as to melt and then cool phase change material of the PCM cell. A PCM cell may be programmed to a one-bit by setting the PCM cell to a crystalline state by crystallizing phase change material.

A memory array comprising PCM cells may be programmed using wordlines or bitlines that provide electrical programming pulses or signals representing one-bits or zero-bits in individual PCM cells. While one wordline may be used to program one row of PCM cells, an adjacent wordline may be used to program an adjacent row of PCM cells. Adjacent rows of PCM cells may be spaced apart to provide structural, electrical, or thermal insulation between the adjacent rows. However, as the density of PCM cells in an array increase, spacing between adjacent rows of PCM cells may decrease, thus reducing the amount of available semiconductor material providing thermal insulation between the adjacent rows. Among other things, thermal contact among PCM cells may undesirably lead to an increased probability that a state of one PCM cell may be disturbed by the state of a neighboring PCM cell. A PCM cell thermally affecting another PCM cell may be called a "proximity-disturb" event, which may include a "program disturb" event or a "read disturb" event, depending on whether a program process or a read process is involved. For example, a zero-bit of a PCM cell may be cyclically re-programmed with a particular frequency in a process of refreshing the state of the PCM cell. Such re-programming a zero-bit may comprise applying a relatively high amplitude electrical programming pulse or signal so as to melt and then cool phase change material of the PCM cell, as mentioned above. A process of melting phase change material of the PCM cell, however, may inadvertently add heat to one or more neighboring PCM cells. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. As the frequency of refreshing the state of a PCM cell increases, so does the probability of occurrence of a program-disturb event, induced by increasing ambient temperatures of a memory array, for example.

PCM cells in a zero-bit, amorphous state may be more susceptible to effects of a program-disturb event compared to PCM cells in a one-bit, crystalline state. Such effects may change a PCM memory cell in a zero-bit state to a one-bit state or vise versa. For example, a program-disturb event may erroneously change a state of a PCM cell from a zero-bit state to a one-bit state. This may be true, at least in part, because an amorphous state may comprise a meta-stable state with respect to a relatively stable crystalline state. Additional energy applied to such an amorphous state (via thermal or electrical energy, for example) may accelerate a crystallization process. Such additional energy may comprise ambient thermal energy from neighboring PCM cells being repeatedly programmed, as mentioned above. In this case, heat generated during programming operation of neighboring PCM cells may diffuse from the neighboring PCM cells to accelerate crystallization of another PCM cell in a zero-bit, amorphous state. In another implementation, a read-disturb event may occur if a PCM cell is read many times during a relatively short period of time to create excess heat.

Two or more PCM cells in adjacent wordlines on particular bit lines of a memory array may lead to undesirable effects of a program-disturb event, as explained above. For example, a PCM cell in a zero-bit state may program-disturb another PCM cell in a zero-bit state. Embodiments described herein include processes or electronic architecture to reduce probability of occurrence of a program-disturb event. For example, one embodiment may involve a process of encoding program bits to be programmed in a memory array to reduce the number of occurrences of two or more adjacent zero bits on particular bit lines of the memory array, as explained in detail below.

In an embodiment, a method to reduce a probability of occurrence of a program-disturb event may comprise partitioning program bits to be written into a memory cell array into two or more portions, and encoding the two or more portions of the program bits so as to reduce occurrences of two or more adjacent memory cells on particular bit lines of said memory cell array having zero-bit states. In one implementation, the two or more portions of program bits may be respectively written on two or more adjacent wordlines of the memory cell array. Though claimed subject matter is not so limited, encoding particular program bits to be written into a memory cell array may comprise using a table that includes bit-codes corresponding to portions of the particular program bits. For example, bit-codes may comprise bit sequences used to encode portions of program bits leading to a reduction of the number of occurrences of two or more adjacent memory cells on particular bitlines having zero-bit states. As mentioned above, a memory cell array may comprise a PCM cell array, wherein a one-bit state corresponds to a crystalline set state of a PCM cell and a zero-bit state corresponds to an amorphous reset state of the PCM cell.

In an embodiment, a non-volatile memory device may include an ability to reduce a probability of occurrence of a program-disturb event. For example, such a memory device may comprise a controller to encode program bits to be written into a memory cell array, and to place the encoded program bits onto two adjacent wordlines of the memory cell array. Encoded program bits may be encoded to reduce the number of occurrences of adjacent zero bits on two adjacent wordlines of memory cells. As described below, a non-volatile memory device may comprise a plurality of wordlines configured in pairs. Wordlines of individual pairs may be separated by a first distance, while pairs of wordlines may be separated by a second distance greater than the first distance. A program-disturb event may occur among wordlines that are paired with one another, whereas a program-disturb event need not occur among wordlines from different pairs, though claimed subject matter is not so limited.

In one implementation, a controller of a non-volatile memory device may comprise circuitry to encode program bits to be written to a memory cell array, wherein such encoding may be based, at least in part, on an ordering of bit values (e.g., zero-bit or one-bit) of the program bits. In another implementation, a controller may encode program bits based, at least in part, on an ordering of bit values of the program bits and a table comprising codes corresponding to the ordering of bit values of the program bits. For example, such codes may comprise bit sequences to encode the program bits so as to lead to a reduction of the number of occurrences of two or more adjacent zero bits on adjacent wordlines of memory cells. Though memory cells may comprise PCM cells, claimed subject matter is not so limited. For example, encoding program bits to be written to a memory array may be performed as described herein for other types of memory for any number of reasons.

FIG. 1 is a schematic diagram of a portion of a memory array 100, according to an embodiment. For example, a memory device may comprise memory array 100 and address decoding circuitry (not shown) to read from or write to selected memory cells via bitlines or wordlines. Memory cells 150 may be connected at intersections of wordlines and bitlines and may be selectively addressed by the wordlines or bitlines. For example, memory cell 155 may be programmed to be in a zero-bit state by placing a zero-bit on wordline WL1 in a bitline BL1 position. Similarly, memory cell 157 may be programmed to be in a one-bit state by placing a one-bit on wordline WL2 in a bitline BL1 position. In another example, FIG. 1 shows wordline WL3 with bits 0-1-0-1 in bitline positions BL1, BL2, BL3, and BL4, respectively. Memory cells 150 may comprise PCM cells, though claimed subject matter is not so limited.

In an embodiment, adjacent wordlines in memory array 100 may be physically spaced apart by two different distances. For example, adjacent wordlines WL9 and WL10 may be spaced apart by a distance D1, while adjacent wordlines WL8 and WL9 may be spaced apart by a distance D2. The different spacing distances may be determined, at least in part, from fabrication architecture of a semiconductor memory device that includes memory array 100, for example. Thus, adjacent wordlines may be physically grouped in pairs with an inter-pair spacing of distance D1, whereas such pairs of wordlines may be spaced apart a distance D2. Referring to FIG. 1, for example, adjacent wordlines WL1 and WL2 comprise a wordline pair separated by a distance D1, adjacent wordlines WL3 and WL4 comprise a wordline pair separated by a distance D1, adjacent wordlines WL5 and WL6 comprise a wordline pair separated by a distance D1, adjacent wordlines WL7 and WL8 comprise a wordline pair separated by a distance D1, and adjacent wordlines WL9 and WL10 comprise a wordline pair separated by a distance D1. In contrast, wordline WL2 and wordline WL3, though they are adjacent to one another, may be separated by a distance D2, which may be greater than inter-pair spacing distance D1. To continue the example, wordline WL4 and wordline WL5 may be separated by a distance D2, wordline WL6 and wordline WL7 may be separated by a distance D2, and wordline WL8 and wordline WL9 may be separated by a distance D2.

As mentioned above, thermal contact among PCM cells may lead to a program-disturb event, wherein a state of one PCM cell may be disturbed by the state of a neighboring PCM cell. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. In memory array 100, for example, memory cells included in wordlines of a wordline pair may be physically near one another so as to be affected by a program-disturb event. More specifically, memory cells included in wordlines of a wordline pair along a same bitline may be physically near enough to one another so as to be affected by a program-disturb event. On the other hand, memory cells included in wordlines of different wordline pairs, even if on a same bitline, may be physically separated enough so as to not be substantially affected by a program-disturb event. Returning to FIG. 1, for example, memory cells in memory cell pair 110 may program-disturb one another, whereas memory cells in memory cell pair 120 need not program-disturb one another.

As discussed above, PCM cells in a zero-bit, amorphous state may be more susceptible to effects of a program-disturb event compared to PCM cells in a one-bit, crystalline state. For example, memory cells in zero-bit states in memory cell pair 110 may program-disturb one another, whereas memory cells 155 and 157 in zero-bit and one-bit states, respectively, need not program-disturb one another.

In one implementation, PCM cells in adjacent wordlines of wordline pairs may be more susceptible to effects of a program-disturb event compared to PCM cells in a same wordline and adjacent bitlines. Such effects may change a PCM memory cell in a zero-bit state to a one-bit state or vise versa. For example, memory cells in memory cell pair 130 need not program-disturb one another, even though the adjacent memory cells may both be in zero-bit states.

Accordingly, as discussed above, it may be desirable to avoid or reduce the number of occurrences of memory cells in adjacent wordlines of a wordline pair along a single bitline to be in a zero-bit state. For example, the occurrence of zero-bit states in memory cells in memory cell pair 110 may be undesirable.

Figure 2:
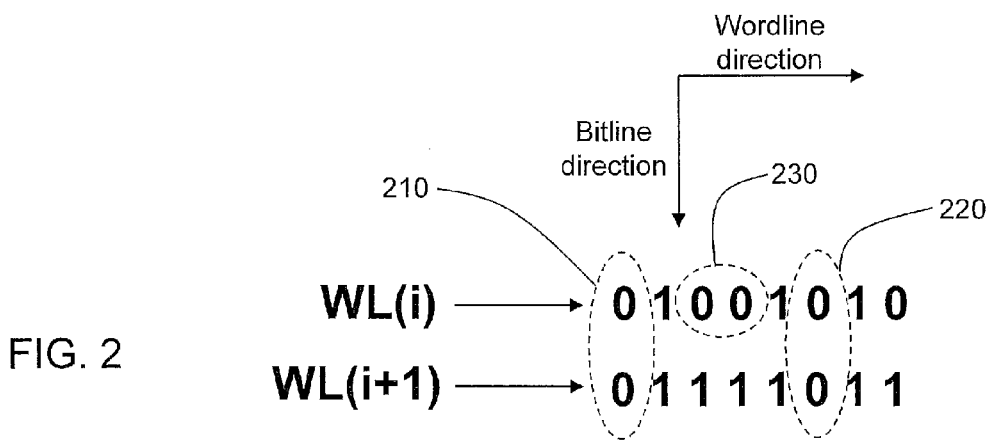
FIG. 2 is a schematic diagram of an arrangement of program bits on adjacent wordlines, according to an embodiment.

FIG. 2 is a schematic diagram of an arrangement program bits on adjacent wordlines, according to an embodiment. FIG. 2 may depict a memory array similar to that of FIG. 1, but without explicitly showing memory cells, wordlines, and bitlines. For example, in FIG. 2, a wordline WL(i) may have bits 0-1-0-0-1-0-1-0 on consecutive bitlines, such as BL1, BL2, BL3, and so on, shown in FIG. 1. An adjacent wordline WL(i+1) may have bits 0-1-1-1-1-0-1-1 on the same consecutive bitlines as for WL(i). As discussed above, PCM cells in a zero-bit, amorphous state may be more susceptible to effects of a program-disturb event compared to PCM cells in a one-bit, crystalline state. Also, PCM cells in adjacent wordlines may be more susceptible to effects of a program-disturb event compared to PCM cells in a same wordline and adjacent bitlines. Thus, zero-bit pair 210, comprising zero bits on a same bitline and adjacent wordlines WL(i) and WL(i+1), may lead to an undesirable program-disturb event. As another example, zero-bit pair 220, comprising zero bits on a same bitline and adjacent wordlines WL(i) and WL(i+1), may also lead to an undesirable program-disturb event. However, in another example, zero-bit pair 230, comprising zero bits on a same wordline WL(i) but adjacent bitlines, need not lead to a program-disturb event. Accordingly, as discussed above, it may be desirable to avoid or reduce the number of occurrences of zero bits on a same bitline and adjacent wordlines.

Figure 3:
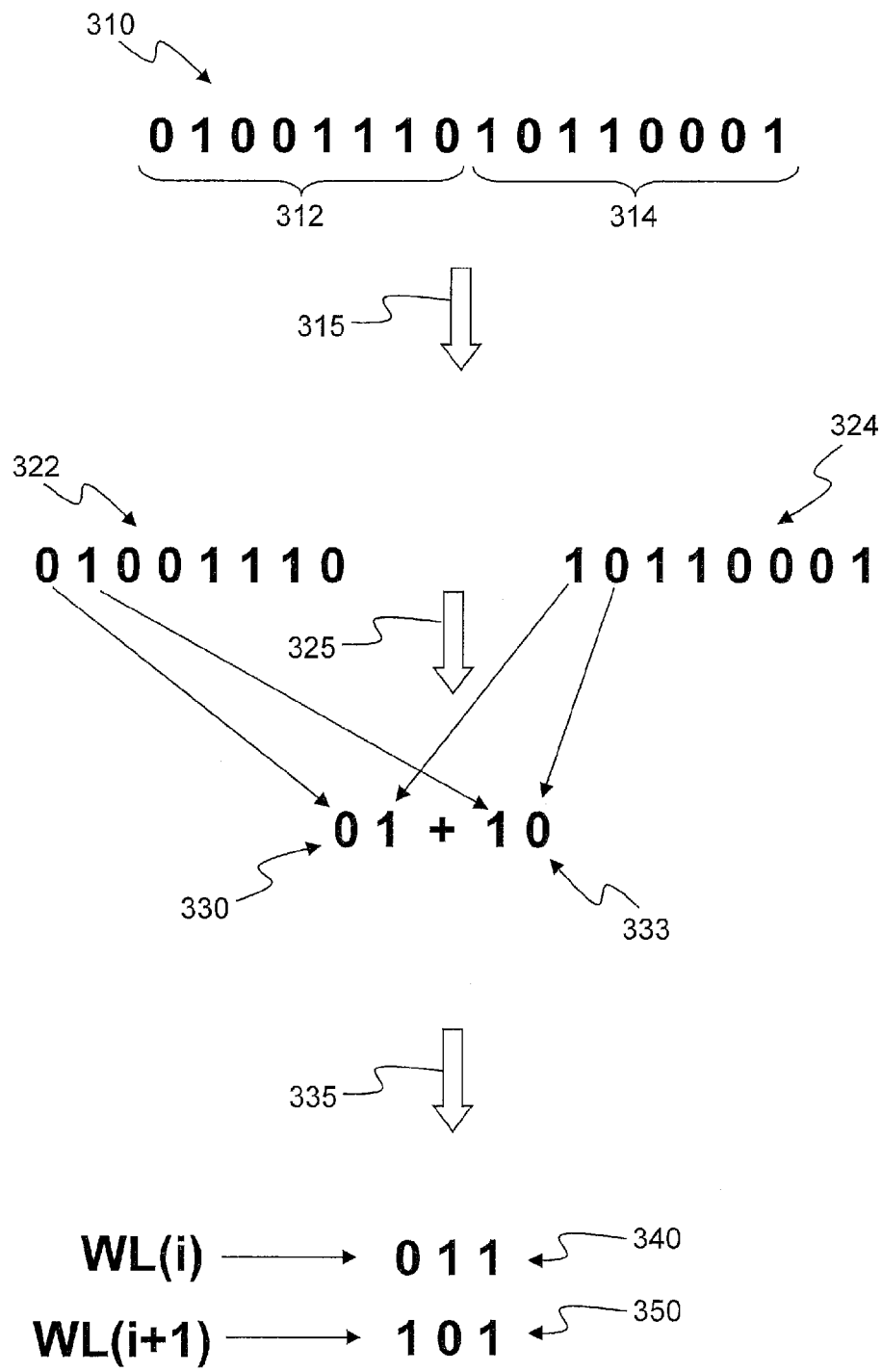
FIG. 3 is a flow diagram of an embodiment of a process to encode program bits to be programmed in a memory array.

FIG. 3 is a flow diagram of an embodiment of a process 300 to encode a group 310 of data bits representing binary states to be programmed in a memory array, such as memory array 100 shown in FIG. 1, for example. Process 300 may comprise a technique to avoid or reduce a number of occurrences of zero bits on a same bitline and adjacent wordlines in the memory array to be programmed. A desirable outcome, for example, is that, during a process of programming a memory array, adjacent wordlines along same bitlines will not both include zero-bits at the same time, regardless of the combination of bits in group 310. Accordingly, a program-disturb event may be avoided.

Group 310 data bits may comprise a byte, a word, or several to several hundred data bits, just to name a few examples. In one implementation, group 310 may comprise an upper-significant-bits portion 312 and a lower-significant-bits portion 314. Each portion may comprise a same number of bits, though claimed subject matter is not so limited. In process portion 315, group 310 may be partitioned into portions 312 and 314, providing bit group 322 and bit group 324. In process portion 325 a combination of bits 330 and 333 may be created from a particular combination of bits of bit group 322 and bit group 324. Though any of a number of possible combinations may be used, in one particular implementation, the most-significant bits from each of bit group 322 and bit group 324 may be combined to create bit combination 330, as shown by arrows in FIG. 3. Also, the next most-significant bits from each of bit group 322 and bit group 324 may be combined to create bit combination 333, also shown by arrows in FIG. 3. In process portion 335, a look-up table, for example, may be used arrive at a wordline bit groups 340 and 350. Wordline bit groups 340 and 350 may respectively comprise bits to be placed on adjacent wordlines, as shown in detail below. In one implementation, a look-up table may be used by looking up the bit values of bit group 322 and bit group 324 and finding a corresponding table value to give wordline bit groups 340 and 350. An example of such a table is shown in Table 1.

TABLE 1

| Line number | Combined Bit combination 330 and bit combination 333 | First wordline | Second wordline |
|---|---|---|---|
| 1 | 0000 | 010 | 101 |
| 2 | 0001 | 110 | 111 |
| 3 | 0010 | 011 | 111 |
| 4 | 0011 | 101 | 111 |
| 5 | 0100 | 011 | 111 |
| 6 | 0101 | 011 | 110 |
| 7 | 0110 | 011 | 101 |
| 8 | 0111 | 110 | 111 |
| 9 | 1000 | 101 | 010 |
| 10 | 1001 | 111 | 110 |
| 11 | 1010 | 111 | 011 |
| 12 | 1011 | 111 | 101 |
| 13 | 1100 | 111 | 011 |
| 14 | 1101 | 110 | 011 |
| 15 | 1110 | 101 | 011 |
| 16 | 1111 | 111 | 110 |

Table 1 may comprise values so that adjacent wordlines along same bitlines do not both include zero-bits at the same time. Of course, tables comprising values different than those in Table 1 may be used, and Table 1 is merely an example. Thus, in the example shown in FIG. 3, combined bit combinations 330 and 333 comprise bit values 0110, located in line 7 of Table 1. 0110 corresponds to a wordline bit group 340 comprising bits 011 and a wordline bit group 350 comprising bits 101. Bits of wordline bit group 340 may be placed on wordline WL(i) and bits of wordline bit group 350 may be placed on adjacent wordline WL(i+1). Accordingly, adjacent wordlines along same bitlines do not both include zero-bits at the same time. In fact, use of any other components of lines 1 through 16 of Table 1 may lead to there being no zero bits adjacent to one another on adjacent wordlines.

In another embodiment, a look-up table, such as Table 1 described above, need not be used to arrive at wordline bit groups 340 and 350. Instead, circuitry comprising logic components, for example, may be used. Such circuitry may be included in a memory controller or peripheral circuitry of a memory array, though claimed subject matter is not so limited. For example, instead of using a look-up table with a combination of bits 330 and 333, as described above, the combination of bits 330 and 333 may be provided to a combination of logic components interconnected so as to produce bit values 340 and 350.

As described so far, process 300 may encode a portion of a group of bits 310 into wordline bit groups 340 and 350. Adjacent wordlines along same bitlines may not both include zero-bits at the same time if wordline bit groups 340 and 350 are respectively placed on the adjacent wordlines, as mentioned above. Repeating at least some portions of process 300, additional bits from bit group 322 and bit group 324 may be used to create another combination of bits 330 and 333 during process portion 325. In one particular implementation, the most-significant bits from each of bit group 322 and bit group 324 that have yet to be used in process portion 325 (such as that described above, for example) may be combined to create bit combination 330. Also, the next most-significant bits from each of bit group 322 and bit group 324 may be combined to create bit combination 333. In process portion 335, a look-up table, for example, may be used to arrive at wordline bit groups 340 and 350, as described above. Bit line groups 340 and 350 may be appended to previously determined bit line groups 340 and 350. Such an iterative process may continue until all bits of bit group 322 and bit group 324 have been encoded by process portions 325 and 335, for example.

Figure 4:
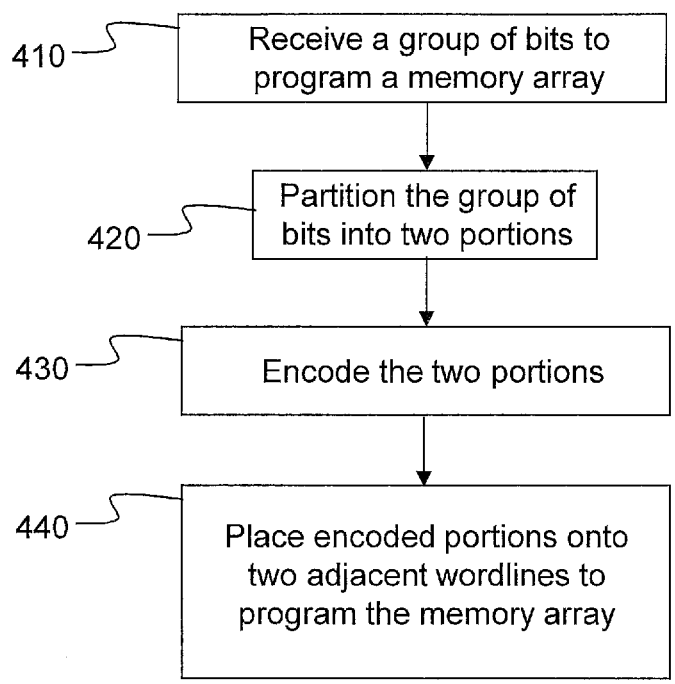
FIG. 4 is another flow diagram of an embodiment of a process to encode program bits to be programmed in a memory array.

FIG. 4 is a flow diagram of an embodiment of a process 400 to encode program bits to be programmed in a memory array. Process 400 may comprise one of an unlimited number of techniques to encode program data to reduce effects of a program-disturb event by avoiding neighboring zero-bits on a bitline. Process 400 merely describes an example of an encoding embodiment, but other encoding techniques may be used. Also, various portions or details of process 400 may be changed. Accordingly, details of process 400 are merely examples, and claimed subject matter is not so limited.

At block 410, a memory controller, or other device to perform process 400, may receive a group of bits to program a memory array. A group of bits may be similar to 310, shown in FIG. 3, though claimed subject matter is not so limited. As explained above, such a group of bits may comprise a byte, a word, or several to several hundred data bits, just to name a few examples. In block 420, the group of bits may be partitioned into two portions, though a partitioning process may partition a group of bits into any number of portions, as in the case of other implementations, for example. The group of bits may be partitioned so that half the number of bits are in one portion and the other half are in another portion. For example, returning to FIG. 3, group 310 may comprise an upper-significant bits portion 312 and a lower-significant bits portion 314 that are partitioned into bit group 322 and bit group 324.

In block 430, two portions of bits determined, at least in part, by the partitioning process of block 420 may be encoded to reduce effects of a program-disturb event by avoiding neighboring zero-bits on a bitline. As mentioned above, such encoding may be performed by any of an unlimited number of encoding techniques. In one technique, described in the example embodiment shown in FIG. 3, most-significant bits from each of two portions of bits (e.g., bit group 322 and bit group 324) may be combined to create a new combination of bits (e.g., bits 330 and 333). The new combination of bits may be applied to a look-up table, such as Table 1, described above, to obtain a pair of encoded program bits that, by design, do not include adjacent zero-bits in a bitline direction. Accordingly, as at block 440, the pair of encoded program bits may be placed onto adjacent wordlines in the memory array without (or with a reduced) occurrence of adjacent zero-bits in the adjacent wordlines.

Figure 5:
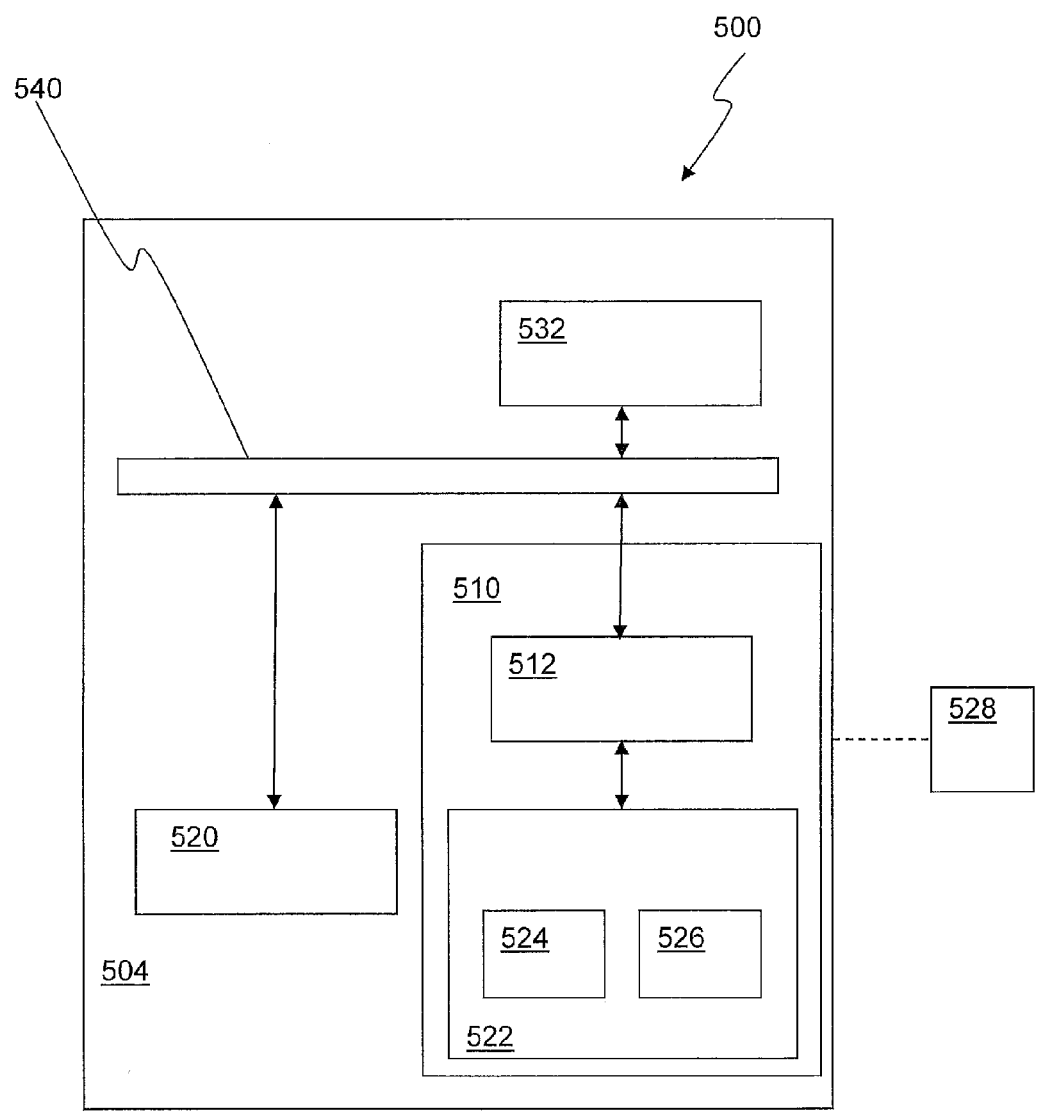
FIG. 5 is a schematic diagram illustrating an embodiment of a computing system.

FIG. 5 is a schematic diagram illustrating an embodiment of a computing system 500 including a memory device 510. Such a computing device may comprise one or more processors, for example, to execute an application or other code. For example, memory device 510 may comprise memory array 100, shown in FIG. 1. A computing device 504 may be representative of any device, appliance, or machine that may be configurable to manage memory device 510. Memory device 510 may include a memory controller 515 and a memory 522, which may comprise PCM, for example. By way of example but not limitation, computing device 504 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider/system; or any combination thereof. It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515.

Processing unit 520 is representative of one or more circuits configurable to perform at least a portion of an information computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may include an operating system configured to communicate with memory controller 515. Such an operating system may, for example, generate commands to be sent to memory controller 515 over bus 540. Such commands may comprise read or write commands. In response to a write command, for example, memory controller 515 may encode program bits to be written into memory 522, and place the encoded program bits onto two or more adjacent wordlines of the memory, wherein the encoded program bits are encoded to reduce the number of occurrences of adjacent zero bits on the adjacent wordlines of memory cells. In one implementation, controller 515 may comprise circuitry (e.g., logic components) to encode program bits based, at least in part, on an ordering of bit values of the program bits. Of course, such details of a portion of memory are merely examples, and claimed subject matter is not so limited.

In a particular implementation, computing system 500 may comprise memory 522 comprising a first number of memory sectors to store information provided by one or more applications and a second number of memory sectors to store ECC associated with the information. Memory 522 may further comprise memory controller 515 to adjust from a first level of error correctability to a second level of error correctability applied to the memory in response to determining that at least a portion of the memory is non-functional.

Memory 522 is representative of any information storage mechanism. Memory 522 may include, for example, a primary memory 524 or a secondary memory 526. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

Secondary memory 526 may include, for example, the same or similar type of memory as primary memory or one or more information storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry or make accessible information, code, or instructions for one or more of the devices in system 500. Computing device 504 may include, for example, an input/output 532. Input/output 532 is representative of one or more devices or features that may be configurable to accept or otherwise introduce human or machine inputs, or one or more devices or features that may be configurable to deliver or otherwise provide for human or machine outputs. By way of example but not limitation, input/output device 532 may include an operatively configured display, speaker, keyboard, mouse, trackball, touch screen, data port, etc.

It will, of course, be understood that, although particular embodiments have just been described, claimed subject matter is not limited in scope to a particular embodiment or implementation. For example, one embodiment may be in hardware, such as implemented on a device or combination of devices, for example. Likewise, although claimed subject matter is not limited in scope in this respect, one embodiment may comprise one or more articles, such as a storage medium or storage media that may have stored thereon instructions capable of being executed by a specific or special purpose system or apparatus, for example, to lead to performance of an embodiment of a method in accordance with claimed subject matter, such as one of the embodiments previously described, for example. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

The terms, "and" and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Embodiments described herein may include machines, devices, engines, or apparatuses that operate using digital signals. Such signals may comprise electronic signals, optical signals, electromagnetic signals, or any form of energy that provides information between locations.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
   partitioning program bits to be written into a memory cell array comprising phase change memory (PCM) cells; and
   transforming said partitioned program bits to programmed states in said memory cell array so as to reduce a number of occurrences of two or more adjacent memory cells on particular bit lines of said memory cell array having zero-bit states and to increase a number of occurrences of two or more adjacent memory cells on said particular bit lines having adjacent zero-bit and one-bit states.

2. The method of claim 1, further comprising:
   respectively writing two or more portions of said partitioned program bits on memory cells of two or more adjacent wordlines of said memory cell array.

3. The method of claim 1, wherein said transforming said partitioned program bits further comprises:
   using a table comprising codes corresponding to said partitioned program bits.

4. The method of claim 3, wherein said codes comprise bit sequences to encode said partitioned program bits to lead to said reduction of the number of occurrences of two or more adjacent memory cells on particular bit lines of said memory cell array having zero-bit states.

5. The method of claim 1, wherein a one-bit state corresponds to a crystalline set state of a PCM cell and a zero-bit state corresponds to an amorphous reset state of said PCM cell.

6. The method of claim 1, wherein said transforming said partitioned program bits further comprises:
   combining a particular number of bits from individual partitions of said partitioned program bits; and
   using a table comprising codes corresponding to the combined bits.

7. A non-volatile memory device comprising:
   a controller to:
      encode program bits to be written to a memory cell array comprising phase change memory (PCM) cells; and
      place said encoded program bits onto two adjacent wordlines of said memory cell array, wherein said encoded program bits are encoded to reduce a number of occurrences of adjacent zero bits on said two adjacent wordlines of memory cells and to increase a number of occurrences of a zero-bit being adjacent to a one-bit on said two adjacent wordlines.

8. The non-volatile memory device of claim 7, further comprising pairs of wordlines, wherein said wordlines of individual pairs are separated by a first distance, and wherein said pairs of wordlines are separated by a second distance greater than said first distance.

9. The non-volatile memory device of claim 8, wherein said two adjacent wordlines comprise said wordlines of individual pairs separated by said first distance.

10. The non-volatile memory device of claim 7, wherein said controller comprises:

circuitry to encode said program bits based, at least in part, on an ordering of bit values of said program bits.

11. The non-volatile memory device of claim 7, wherein said program bits are encoded based, at least in part, on an ordering of bit values of said program bits and a table comprising codes corresponding to said ordering of bit values of said program bits.

12. The non-volatile memory device of claim 11, wherein said codes comprise bit sequences to encode said program bits to lead to said reduction of the number of occurrences of two or more adjacent zero bits on said adjacent wordlines of memory cells.

13. The non-volatile memory device of claim 7, wherein the memory device is incorporated in at least one of the following: a desktop computer, a laptop computer, a workstation, a server device, a personal digital assistant, a mobile communication device, or any combination thereof.

14. A system comprising:
a processor to host one or more applications and to initiate a write operation to store program bits in a memory cell array comprising phase change memory (PCM) cells; and
a controller to:
encode program bits to be written into said memory cell array; and
place said encoded program bits onto two or more adjacent wordlines of said memory cell array, wherein said encoded program bits are encoded to reduce a number of occurrences of adjacent zero bits on said adjacent wordlines of memory cells and to increase a number of occurrences of adjacent zero and one bits on said two adjacent wordlines.

15. The system of claim 14, wherein said controller comprises:
circuitry to encode said program bits based, at least in part, on an ordering of bit values of said program bits.

16. The system of claim 14, wherein said program bits are encoded based, at least in part, on an ordering of bit values of said program bits and a table comprising codes corresponding to said ordering of bit values of said program bits.

17. The system of claim 14, wherein a one-bit corresponds to a crystalline set state of a PCM cell and a zero-bit corresponds to an amorphous reset state of said PCM cell.

* * * * *